(12) United States Patent
Hosagavi Puttaraju et al.

(10) Patent No.: US 10,944,377 B2
(45) Date of Patent: Mar. 9, 2021

(54) BROADBAND POWER SPLITTER

(71) Applicant: SKYWORKS SOLUTIONS, INC., Woburn, MA (US)

(72) Inventors: Anuranjan Hosagavi Puttaraju, Cedar Rapids, IA (US); Gunjan Pandey, Ames, IA (US); Paul Raymond Andrys, Swisher, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/236,432

(22) Filed: Dec. 29, 2018

(65) Prior Publication Data

US 2019/0214961 A1 Jul. 11, 2019

Related U.S. Application Data

(60) Provisional application No. 62/612,536, filed on Dec. 31, 2017.

(51) Int. Cl.
| | |
|---|---|
| *H03H 7/46* | (2006.01) |
| *H03H 11/36* | (2006.01) |
| *H03H 7/48* | (2006.01) |

(52) U.S. Cl.
CPC .............. *H03H 7/461* (2013.01); *H03H 7/48* (2013.01); *H03H 11/362* (2013.01); *H03H 2210/025* (2013.01)

(58) Field of Classification Search
CPC ............ H03H 7/46; H03H 7/48; H03H 7/461; H03H 11/362; H03H 2201/025; H01P 5/12
USPC ........................................................ 333/132
See application file for complete search history.

(56) References Cited

U.S. PATENT DOCUMENTS

| | | | | |
|---|---|---|---|---|
| 5,745,846 A | * | 4/1998 | Myer | ............... H03G 3/3042 330/126 |
| 2013/0127564 A1 | * | 5/2013 | Ding | ..................... H01P 5/16 333/125 |

* cited by examiner

*Primary Examiner* — Robert J Pascal
*Assistant Examiner* — Kimberly E Glenn
(74) *Attorney, Agent, or Firm* — Chang & Hale LLP

(57) ABSTRACT

Broadband power splitter. In some embodiments, a power splitter can include an input port, a first output port and a second output port. The power splitter can further include a first signal path implemented between the input port and the first output port, and a second signal path implemented between the input port and the second output port. Each of the first and second signal paths can include a variable capacitance configured to provide a plurality of capacitance values that result in different frequency responses of the respective signal path.

19 Claims, 10 Drawing Sheets

| 00 (1.1pF) | 01/10 (1.3pF) | 11 (1.5pF) |
|---|---|---|
| B1 | B2_3_39 | B3 |
| B66 | B25 | B39 |
| B34 | B2 | |
| B1_4_66 | | |

FIG.10

| MB1 | MB2 | MB3 | | MB4 | MLB |
|---|---|---|---|---|---|
| B1: 2110-2170 | B2: 1930-1990 | B34: | 2010-2025 | B25: 1930-1995 | |
| B66: 2110-2200 | B3: 1805-1880 | B1_4_66: | 2110-2200 | B39: 1880-1920 | |
| | | B2_3_39: | 1930-1990 1805-1880 1880-1920 | | |

FIG.11

BROADBAND POWER SPLITTER

CROSS-REFERENCE TO RELATED APPLICATION(S)

This application claims priority to U.S. Provisional Application No. 62/612,536 filed Dec. 31, 2017, entitled BROADBAND POWER SPLITTER, the disclosure of which is hereby expressly incorporated by reference herein in its respective entirety.

BACKGROUND

Field

The present disclosure relates to signal splitters for radio-frequency (RF) applications.

Description of the Related Art

In radio-frequency (RF) applications, a signal can be power split into a plurality of paths. Each of such paths can be configured to process the respective split portion of the signal. In some applications, such processed signals from the paths can be combined for further processing.

SUMMARY

In accordance with some implementations, the present disclosure relates to a power splitter that includes an input port, a first output port and a second output port. The power splitter further includes a first signal path implemented between the input port and the first output port, and a second signal path implemented between the input port and the second output port. Each of the first and second signal paths includes a variable capacitance configured to provide a plurality of capacitance values that result in different frequency responses of the respective signal path.

In some embodiments, each of the first and second signal paths can include an input capacitance C1 and an output capacitance C2 arranged in series between the input port and the respective output port, such that the output capacitance C2 is the variable capacitance. Each of the first and second signal paths can further include an inductance L that couples a node between C1 and C2 to a ground. The inductance L can be implemented as an inductor. The input capacitance C1 of the first signal path can be substantially the same as the input capacitance C1 of the second signal path.

In some embodiments, the power splitter can further include a control circuit configured to provide control signals to each of the first and second signal paths to thereby select an output capacitance value for the variable capacitance of the respective signal path. The control circuit can be configured to provide the control signal based on, for example, a two-bit input signal. The control circuit can be configured to operate with, for example, mobile industry processor interface (MIPI) standard.

In some embodiments, the variable capacitance can include a plurality of capacitances arranged to be electrically parallel, with each of at least some of the electrically parallel capacitances being coupled to a respective switch, such that different states of the one or more switches allow different electrically parallel capacitances to be connected to provide a respective effective capacitance value for the variable capacitance. Each of the electrically parallel capacitances can be implemented as a capacitor. The electrically parallel capacitors can include a first capacitor without a corresponding switch, and one or more capacitors each having a respective switch in series. By way of an example, the one or more capacitors electrically parallel with the first capacitor can include a second capacitor and a third capacitor each having a respective switch in series.

In some embodiments, the frequency response can include an isolation characteristic between the first and second output ports. In some embodiments, the first and second signal paths can be configured to route respective signals split from a received signal.

In some embodiments, the power splitter can be configured to support carrier aggregation operation involving respective signals in the first and second signal paths. Such carrier aggregation operation can include, for example, a downlink carrier aggregation operation.

In some teachings, the present disclosure relates to a radio-frequency module that includes a packaging substrate configured to receive a plurality of components, and a power splitter circuit implemented on the packaging substrate. The power splitter circuit includes an input port, a first output port and a second output port. The power splitter circuit further includes a first signal path implemented between the input port and the first output port, and a second signal path implemented between the input port and the second output port. Each of the first and second signal paths includes a variable capacitance configured to provide a plurality of capacitance values that result in different frequency responses of the respective signal path.

In some embodiments, the radio-frequency module can be configured to process a received signal. For example, the radio-frequency module can be a front-end module. In another example, the radio-frequency module can be a diversity-receive module.

In some embodiments, the radio-frequency module can further include a controller configured to provide control signals to each of the first and second signal paths to thereby select an output capacitance value for each of the variable capacitance of the respective signal path.

In some implementations, the present disclosure relates to a wireless device that includes an antenna configured to receive a signal, and an input signal path coupled to the antenna and having a power splitter circuit. The power splitter circuit is configured to split the received signal from the input signal path into a first signal and a second signal path. The power splitter circuit includes an input port, a first output port and a second output port, such that the first signal path is implemented between the input port and the first output port, and the second signal path is implemented between the input port and the second output port. Each of the first and second signal paths includes a variable capacitance configured to provide a plurality of capacitance values that result in different frequency responses of the respective signal path.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 10 shows an example of how different cellular bands can be supported by the power splitter of FIG. 6 and the logic circuit of FIG. 9.

FIG. 11 shows an example band coverage map that can be achieved by the example control scheme of FIG. 10.

DETAILED DESCRIPTION OF SOME EMBODIMENTS

The headings provided herein, if any, are for convenience only and do not necessarily affect the scope or meaning of the claimed invention.

By way of an example, to process a carrier aggregated, intra-band, non-contiguous down link signal (e.g., LTE down link signal), the signal is power split to accommodate two independent down-conversion/demodulation paths. Such power splitting is typically achieved by a power splitter circuit implemented along a receive path. For example, a power splitter can be implemented to follow a low-noise amplifier (LNA), and can be located in a front-end (FE) module (e.g., having switch/filter/LNA), in a transceiver, or as discrete implementation between the front-end and the transceiver.

In some embodiments, a power splitter can be configured to be passive to maintain system linearity and narrowband to minimize or reduce implementation loss. For example, a Wilkinson splitter may be used since the two outputs are approximately equal in amplitude and phase, and are highly isolated.

A typical quarter-wave based Wilkinson splitter is narrow band and cannot cover wide frequency ranges such as mid band (1.8 GHz-2.2 GHz) without performance degradation (e.g., output isolation degradation). To reduce area requirements, a mid-band Wilkinson splitter is typically implemented as a high-pass lumped-element equivalent rather than a distributed transmission line structure. For example, a post-LNA 3 dB power splitter can reside on an LNA silicon-on-insulator (SOI) die, and such a power splitter typically does not meet a minimum 25 dB output isolation requirement across the 1.8 GHz to 2.2 GHz mid band.

Figure 1:
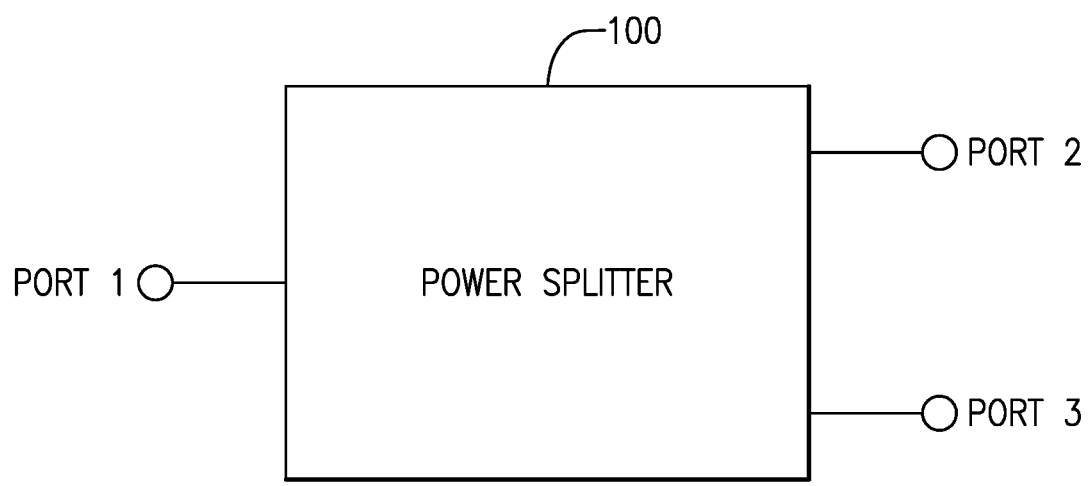
FIG. 1 depicts a power splitter that can be configured to provide one or more desirable functionalities as described herein.

Described herein are examples related to a power splitter having a number of desirable features, including high isolation properties over a wide band. FIG. 1 depicts a power splitter 100 that can be configured to provide such desirable functionalities. In some embodiments, such a power splitter can include three ports (Port 1, Port 2, Port 3), where a signal to be split can be provided at Port 1, and the two split signals can be output at Port 2 and Port 3. In some embodiments, the power splitter 100 of FIG. 1 can be implemented as a modified Wilkinson splitter. However, it will be understood that one or more features of the present disclosure can also be implemented in other types of splitters.

Figure 2:
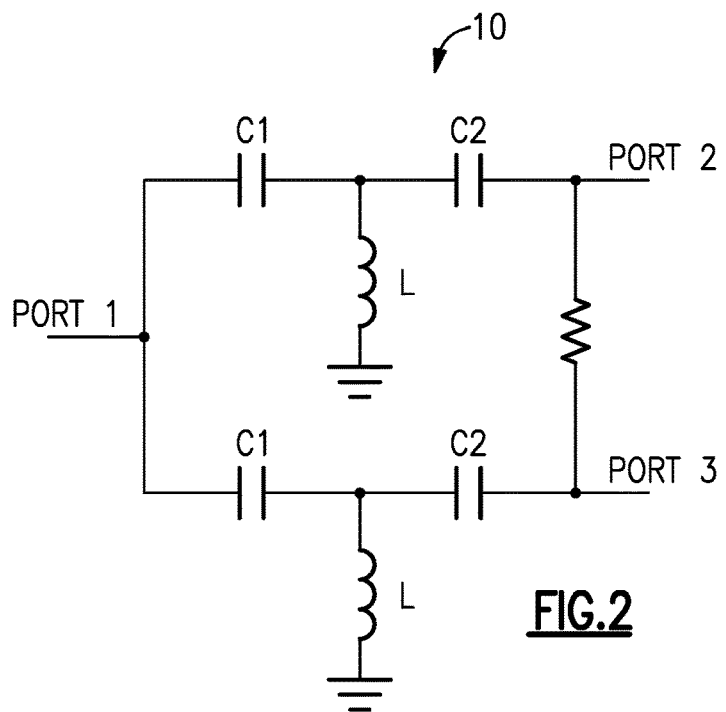
FIG. 2 shows a typical Wilkinson splitter configured to receive a signal and provide two split signals.

FIG. 2 shows a typical Wilkinson splitter 10 configured to receive a signal at Port 1 and provide two split signals at Port 2 and Port 3. The input port (Port 1) and the first output port (Port 2) are shown to be coupled by capacitances C1, C2, and a node between C1 and C2 is shown to be coupled to ground through an inductance L. Similarly, the input port (Port 1) and the second output port (Port 3) are shown to be coupled by capacitances C1, C2, and a node between C1 and C2 is shown to be coupled to ground through an inductance L. The two output ports (Port 2, Port 3) are shown to be coupled by a resistance. For the purpose of description, it will be assumed that C1 of the first path and C1 of the second path are generally the same. Similarly, it will be assumed that C2 of the first path and C2 of the second path are generally the same. Similarly, it will be assumed that L of the first path and L of the second path are generally the same.

Figure 3:
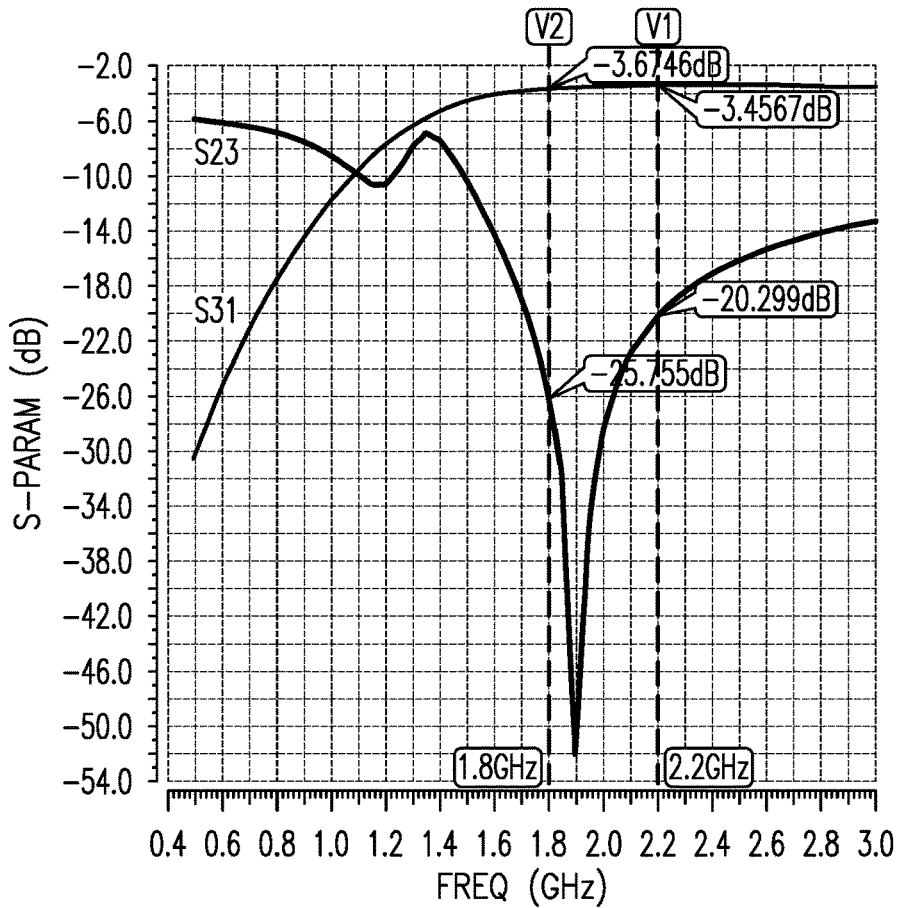
FIG. 3 shows an isolation plot for the Wilkinson splitter of FIG. 2, as a function of frequency, for a given set of capacitance and inductance values.

Configured in the foregoing manner, a typical output isolation (S23) target of 25 dB cannot be achieved across a 400 MHz bandwidth (e.g., from 1.8 GHz to 2.2 GHz). For example, FIG. 3 shows an isolation plot (S23) for the Wilkinson splitter of FIG. 2, as a function of frequency, for a given set of capacitance and inductance values. One can see that at the lower end (1.8 GHz) of the 400 MHz bandwidth, isolation is acceptable at 25.755 dB. Acceptable isolation is shown to be provided for about lower half of the 400 MHz bandwidth. However, as the frequency increases, isolation magnitude is less than the 25 dB threshold; and at the upper end (2.2 GHz) of the 400 MHz bandwidth, isolation is at 20.299 dB.

Figure 4:
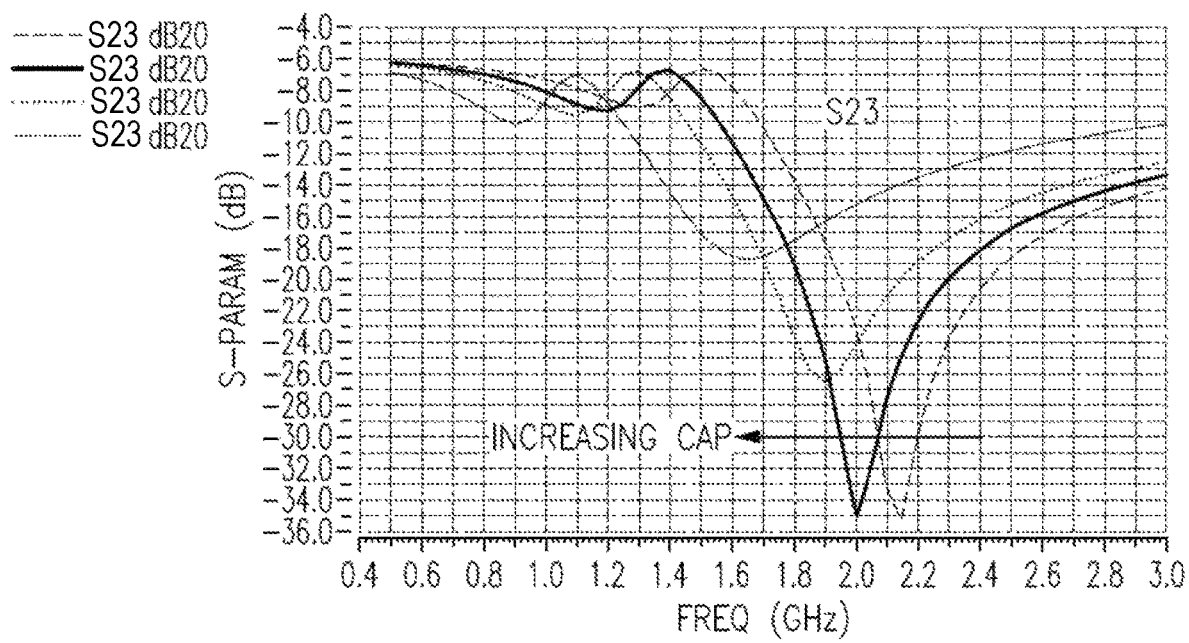
FIG. 4 shows a number of isolation plots corresponding to different values of capacitance C2 of the Wilkinson splitter of FIG. 2.

Referring to the example Wilkinson splitter of FIG. 2, it is noted that as the value of C2 changes, the corresponding isolation profile S23 also changes. For example, FIG. 4 shows a number of isolation plots corresponding to different values of C2. One can see that as C2 increases, the dip structure (when plotted as shown) moves to a lower frequency. It is also noted that for the example 400 MHz bandwidth between 1.8 GHz and 2.2 GHz, significant change in dip structure exists with the change in C2.

Figure 5:
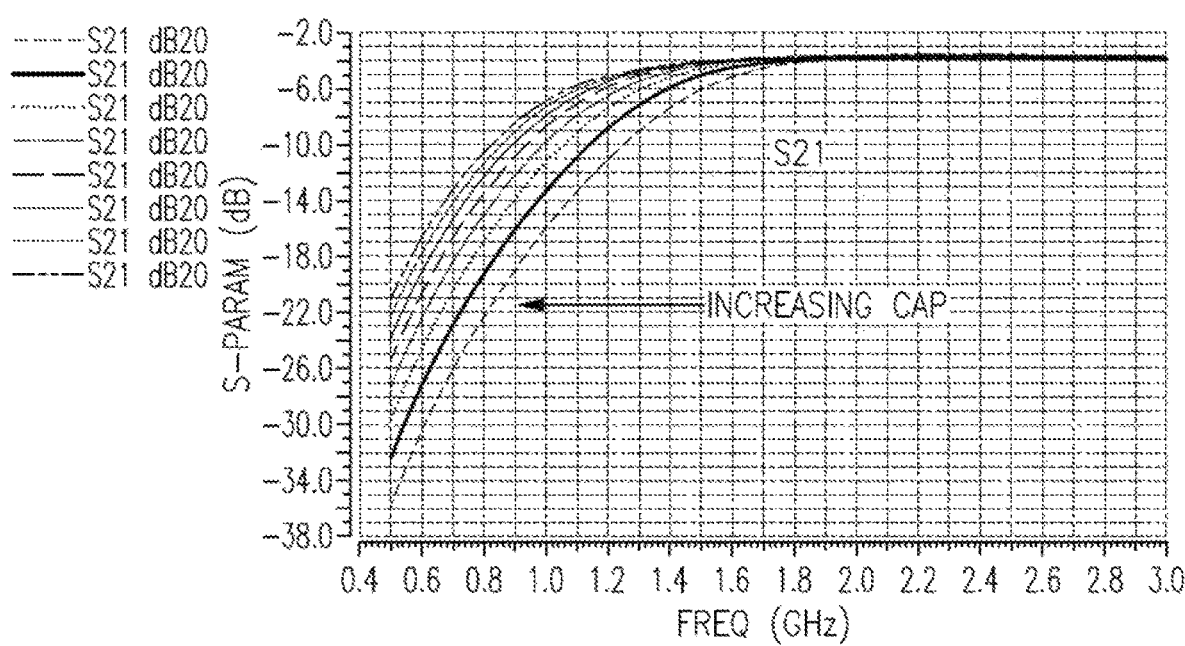
FIG. 5 shows a number of insertion loss plots corresponding to different values of C2 of the Wilkinson splitter of FIG. 2.

Referring to the example Wilkinson splitter of FIG. 2, it is also noted that as the value of C2 changes, the corresponding insertion loss profile S21 also changes. For example, FIG. 5 shows a number of insertion loss plots corresponding to different values of C2. One can see that as C2 increases, the waterfall structure (when plotted as shown) moves to a lower frequency. It is also noted that for the example 400 MHz bandwidth between 1.8 GHz and 2.2 GHz, the change in C2 results in little or no change in insertion loss S21.

Figure 6:
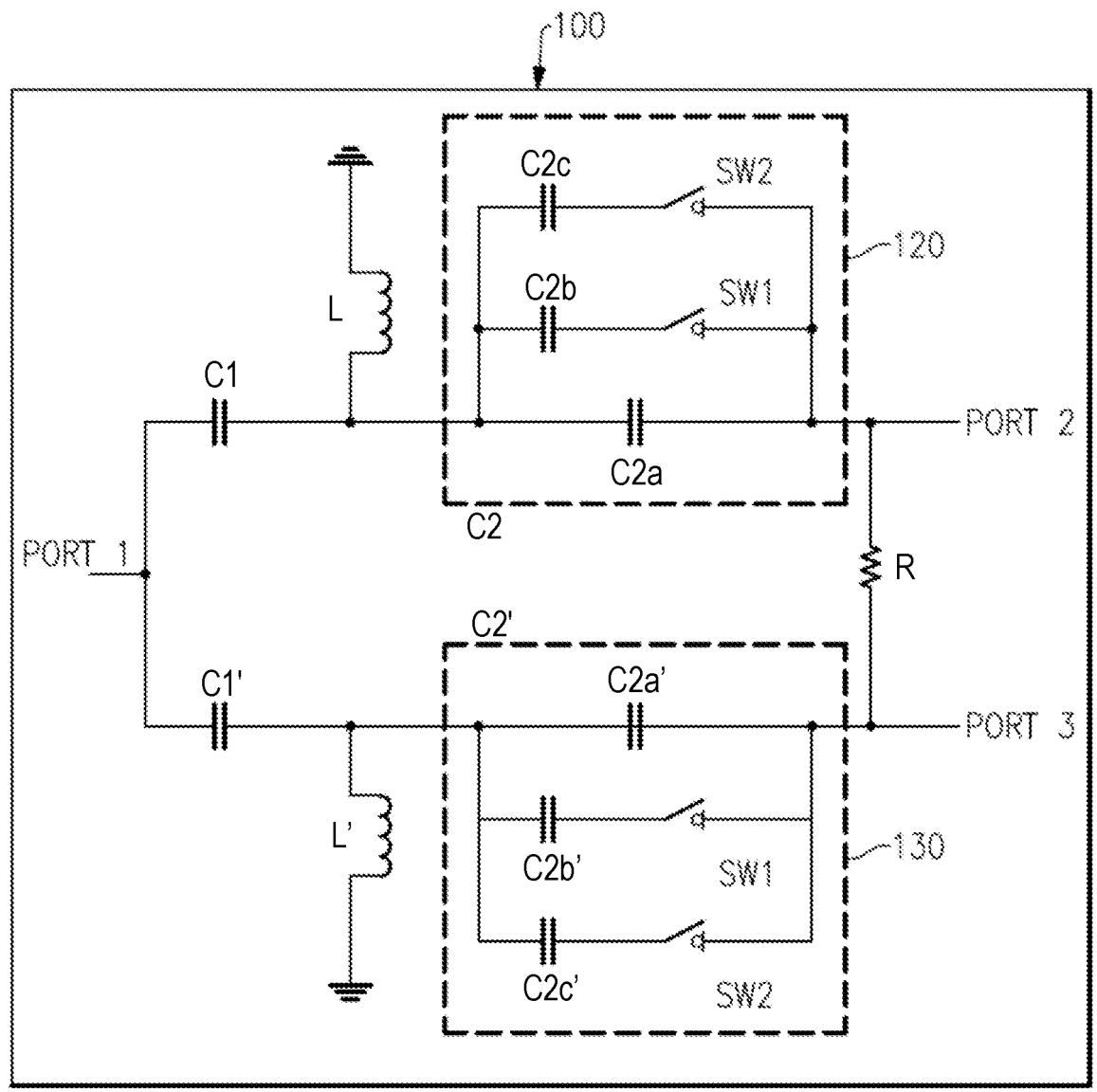
FIG. 6 shows a power splitter that can be a more specific example of the power splitter of FIG. 1.

FIG. 6 shows a power splitter 100 that can be a more specific example of the power splitter 100 of FIG. 1. In some embodiments, the example power splitter 100 of FIG. 6 can be implemented as a modified configuration of the Wilkinson splitter 10 of FIG. 2. However, it will be understood that one or more features of the present disclosure can also be implemented with other types of power splitters.

In the example of FIG. 6, the power splitter 100 is shown to be configured to receive a signal at Port 1 and provide two split signals at Port 2 and Port 3, similar to the example of FIG. 2. The input port (Port 1) and the first output port (Port 2) are shown to be coupled by capacitances C1 and C2 (indicated as 120), and a node between C1 and C2 is shown to be coupled to ground through an inductance L. Similarly, the input port (Port 1) and the second output port (Port 3) are shown to be coupled by capacitances C1' and C2' (indicated as 130), and a node between C1' and C2' is shown to be coupled to ground through an inductance L'. The two output ports (Port 2, Port 3) are shown to be coupled by a resistance R.

In the example of FIG. 6, at least one of the capacitances C1 and C2 of the first path (between Port 1 and Port 2) can be implemented as a variable capacitance capable of providing a plurality of capacitance values. Similarly, at least one of the capacitances C1' and C2' of the second path (between Port 1 and Port 3) can be implemented as a variable capacitance capable of providing a plurality of capacitance values. For example, C2 of the first path can include capacitances C2a, C2b, C2c implemented to be electrically parallel, with some or all of such parallel capacitances having respective switch(es) (e.g., switch SW1 in series with C2b, and switch SW2 in series with C2c), so as to allow C2 to have different combinations of C2a, C2b, C2c and respective capacitance values. Similarly, C2' of the second path can include capacitances C2a', C2b', C2c' implemented to be electrically parallel, with some or all of such parallel capacitances having respective switch(es) (e.g., switch SW1 in series with C2b', and switch SW2 in series with C2c'), so as to allow C2' to have different combinations of C2a', C2b', C2c' and respective capacitance values.

Tables 1A and 1B list examples of effective capacitances that can be provided for C2 and C2', respectively, with different states of the corresponding switches.

TABLE 1A

| SW1 state | SW2 state | Effective value of C2 |
|---|---|---|
| OFF | OFF | C2a |
| ON | OFF | C2a + C2b |
| OFF | ON | C2a + C2c |
| ON | ON | C2a + C2b + C2c |

TABLE 1B

| SW1 state | SW2 state | Effective value of C2' |
|---|---|---|
| OFF | OFF | C2a' |
| ON | OFF | C2a' + C2b' |
| OFF | ON | C2a' + C2c' |
| ON | ON | C2a' + C2b' + C2c' |

In some embodiments, the capacitance C1 of the first path and the capacitance C1' of the second path can have approximately the same value. Similarly, the inductance L of the first path and the inductance L' of the second path can have approximately the same value.

The effective capacitance value of C2 (120) of the first path and the effective capacitance value C2' (130) of the second path may or may not be the same. In some embodiments, the capacitance C2a of the first path and the capacitance C2a' of the second path can have approximately the same value; the capacitance C2b of the first path and the capacitance C2b' of the second path can have approximately the same value; and the capacitance C2c of the first path and the capacitance C2c' of the second path can have approximately the same value. With such a configuration, the effective capacitance value of C2 (120) of the first path and the effective capacitance value C2' (130) of the second path can have approximately the same value with appropriate states of the switches in the first and second paths.

Table 2 lists example values of C1, L, C2a, C2b, C2c, L', C2a', C2b', C2c' that can be implemented to have the power splitter 100 support an example broadband as described herein. It will be understood that other values of capacitances and inductances can be utilized to have the power splitter 100 support other broadbands. At least for the example of Table 2, the resistance R can have a value of approximately 100 ohms.

TABLE 2

| Circuit element | Example value |
|---|---|
| C1 = C1' | 1.5 pF |
| L = L' | 6.2 nH |
| C2a = C2a' | 1.1 pF |
| C2b = C2b' | 0.2 pF |
| C2c = C2c' | 0.2 pF |

Referring to the example of FIG. 6 and Table 2, it is noted that the variable output capacitance C2 (or C2') of each of the first and second paths includes three example capacitances in parallel. The first capacitance C2a (or C2a') is shown to have an example value of 1.1 pF, the second capacitance C2b (or C2b') is shown to have an example value of 0.2 pF, and the third capacitance C2c (or C2c') is shown to have an example value of 0.2 pF. Accordingly, each of the variable capacitances C2 (120), C2' (130) can have the following capacitance values of Table 3, depending on the states of the switches SW1, SW2.

TABLE 3

| SW1 state | SW2 state | Effective value of C2 (or C2') |
|---|---|---|
| OFF | OFF | 1.1 pF |
| ON | OFF | 1.3 pF |
| OFF | ON | 1.3 pF |
| ON | ON | 1.5 pF |

In some embodiments, the switches of the variable capacitances C2 (120), C2' (130) can be controlled by a controller, depending on the operating mode of, for example, a wireless device. Examples of such control functionality of the variable capacitances are described herein in greater detail.

It is noted that an example wideband range (e.g., 400 MHz wideband between 1.8 GHz and 2.2 GHz) may cover a plurality of operating frequency bands such as cellular bands. Thus, while any given value of C2 (or C2') may not provide wideband capability (e.g., acceptable isolation) for the entire wideband, a selected value of C2 (or C2') can provide acceptable performance characteristics (e.g., acceptable isolation and acceptable insertion loss) for one or more frequency bands within the wideband. Accordingly, the value of C2 (or C2') can be set appropriately, depending on the operating frequency band, to provide desirable performance for that operating frequency band. Thus, the plurality of values of C2 (or C2') can be selected to provide desirable performance characteristics for a plurality of frequency bands within (or overlapping with) a given wideband range.

It is noted that in the example of FIG. 6 and Tables 2 and 3, four states are possible for each of the variable capacitances C2. It will be understood that other numbers of states of C2 are also possible by implementing different numbers of capacitances and/or switches.

It is also noted that in the example of FIG. 6 and Tables 2 and 3, variable capacitance functionality of C2 is provided by a parallel combination of capacitors and switches. It will be understood that variable capacitance can also be implemented in other manners.

It is also noted that in the example of FIG. 6 and Tables 2 and 3, capacitance C2 is configured to be variable. It will be understood that variable functionality can also be implemented for one or more circuit elements, either by itself/themselves, or in combination with C2.

Figure 7:
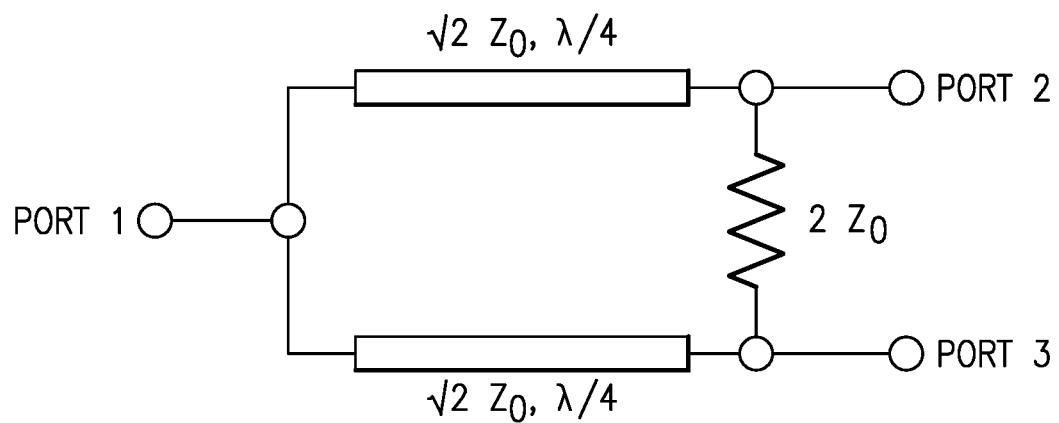
FIG. 7 shows an example of how broadband isolation functionality can be achieved with the power splitter of FIG. 6.
Figure 8:
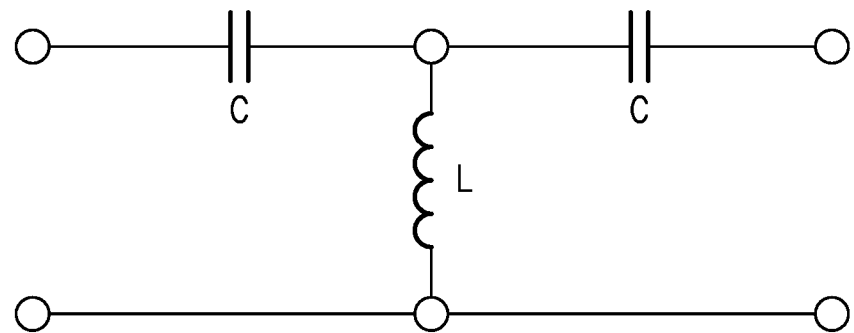
FIG. 8 shows another example of how broadband isolation functionality can be achieved with the power splitter of FIG. 6.

FIGS. 7 and 8 show additional examples of how broadband isolation functionality can be achieved with the power splitter configuration of FIG. 6. Referring to FIG. 7, it is noted that a Wilkinson splitter is typically designed to provide an impedance of $Z_0$=50 ohms. Thus, each of the two split paths can be configured to provide a quarter-wave phase shift and an impedance of $\sqrt{2}Z_0$. Further, the resistance R between the two output ports (Port 2, Port 3) can be selected to be $2Z_0$=100 ohms.

Referring to FIG. 8, it is further noted that each of the two split paths can be characterized as a high-pass lumped model of a quarter-wave transmission line. More particularly, a T-high-pass model can be utilized with two capacitances (C) in series, with an inductive grounding of a node between the two capacitances. With such a configuration, the inductance can be calculated as $$L = \frac{\sqrt{2}Z_0}{\omega \sin\theta}, \quad (1)$$

and the capacitance can be calculated as $$C = \frac{1}{\sqrt{2}Z_0\omega}\sqrt{\frac{1+\cos\theta}{1-\cos\theta}}. \quad (2)$$

Since the transmission line is a quarter-wave line, $\theta$=90°; thus, $\cos\theta$=0 and $\sin\theta$=1. Accordingly, $$L = \frac{\sqrt{2}Z_0}{\omega}, \text{ and} \quad (3)$$

$$C = \frac{1}{\sqrt{2}Z_0\omega}, \quad (4)$$

In some embodiments, high-pass functionality based on the foregoing model can be utilized to calculate or estimate a capacitance value among a plurality of possible values.

Figure 9:
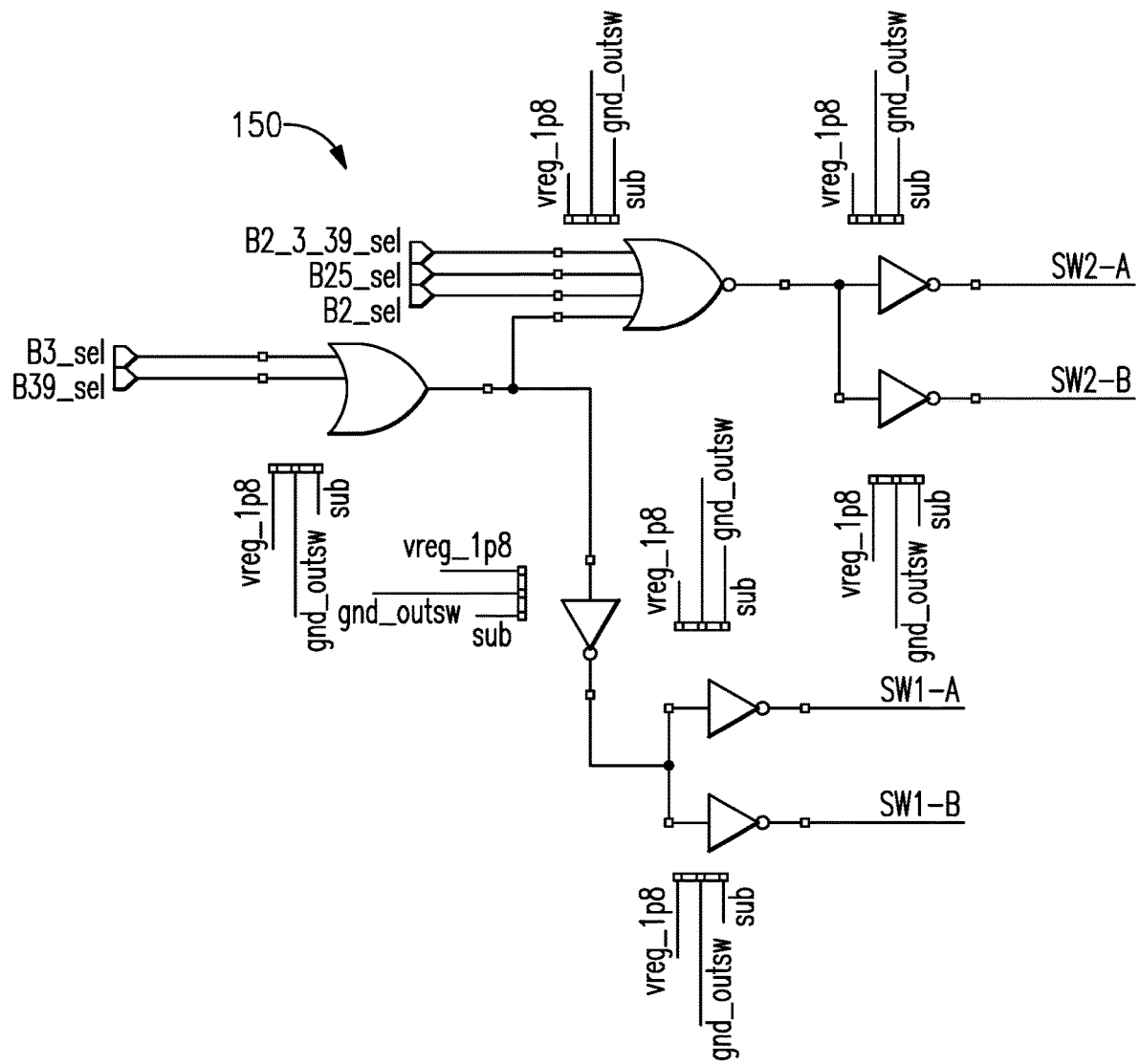
FIG. 9 shows an example of a logic circuit that can be implemented to control the power splitter of FIG. 6.

FIG. 9 shows an example of a logic circuit 150 that can be implemented to control the power splitter circuit 100 of FIG. 6. In the examples of FIGS. 6 and 9, it is noted that with a two-bit control input, a number of cellular bands can be covered, thus in effect making the power splitter circuit 100 a broadband circuit.

Figure 12:
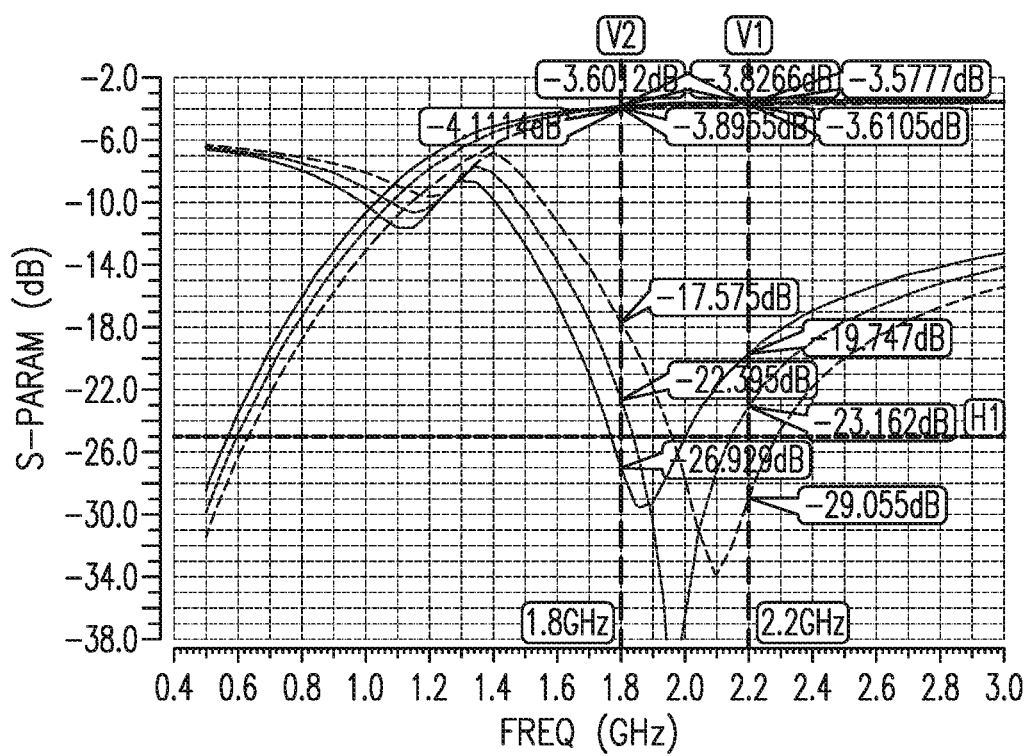
FIG. 12 shows examples of isolation performance that can be achieved with the example control scheme of FIG. 10.

For example, and as described herein in reference to Table 3, there are four different states that can be achieved with various combinations of the switch states. Referring to Table 3 and FIG. 9, and an example band table in FIG. 10, it is noted that two example control inputs B3_sel and B39_sel can be provided. If both of B3_sel and B39_sel are low ("00"), then the effective capacitance of C2 is 1.1 pF, and the resulting isolation profile allows operation in example cellular bands B1, B66, B34 and a combination B1_4_66. In FIG. 12, the corresponding isolation curve for such an example setting is the right-most dip structure (among the three example dip structures).

If one of B3_sel and B39_sel is low and the other is high ("01" or "10"), then the effective capacitance of C2 is 1.3 pF, and the resulting isolation profile allows operation in example cellular bands B25, B2 and a combination B2_3_39. In FIG. 12, the corresponding isolation curve for such an example setting is the middle dip structure (among the three example dip structures).

If both of B3_sel and B39_sel are high ("11"), then the effective capacitance of C2 is 1.5 pF, and the resulting isolation profile allows operation in example cellular bands B3 and B39. In FIG. 12, the corresponding isolation curve for such an example setting is the left-most dip structure (among the three example dip structures).

FIG. 11 shows an example band coverage map that can be achieved by the examples of FIGS. 6, 9 and 10. For example, a first mid-band (MB1) can be covered to include B1 (Rx, 2110 MHz-2170 MHz) and B66 (Rx, 2110 MHz-2200 MHz). In another example, a second mid-band (MB2) can be covered to include B2 (Rx, 1930 MHz-1990 MHz) and B3 (Rx, 1805 MHz-1880 MHz). In yet another example, a third mid-band (MB3) can be covered to include B34 (Rx, 2010 MHz-2025 MHz), B1_4_66 (2010-2200) and B2_3_39 (Rx, 1930 MHz-1990 MHz, 1805 MHz-1880 MHz, 1880 MHz-1920 MHz). In yet another example, a fourth mid-band (MB4) can be covered to include B25 (Rx, 1930 MHz-1995 MHz) and B39 (Rx, 1880 MHz-1920 MHz).

It will be understood that a power splitter having one or more features as described herein can be configured to provide coverages of other frequency bands, including at least some of the example cellular bands listed herein. It will also be understood that a power splitter having one or more features as described herein can be configured to support either or both of receive and transmit operations.

In some embodiments, a power splitter having one or more features as described herein can be configured such that the variable capacitance values are tuned according to corresponding isolation nulls (e.g., dip structures) as described herein. It will be understood that other coverages of a plurality of frequency regions can also be implemented. For example, in some embodiments, a given wideband can be divided into a plurality of frequency regions, regardless of presence or absence of cellular frequencies.

In some embodiments, the plurality of frequency bands covered by different settings of a power splitter can be such that the covered bands provide substantially contiguous coverage within a given wideband. In some embodiments, however, a plurality of covered frequency bands provided by different settings of a power splitter may or may not necessarily provide contiguous coverage within the given wideband. For example, there may be a frequency region within the wideband that is not utilized at all. Thus, in such a situation, such a frequency region may be omitted from coverage.

Figure 13:
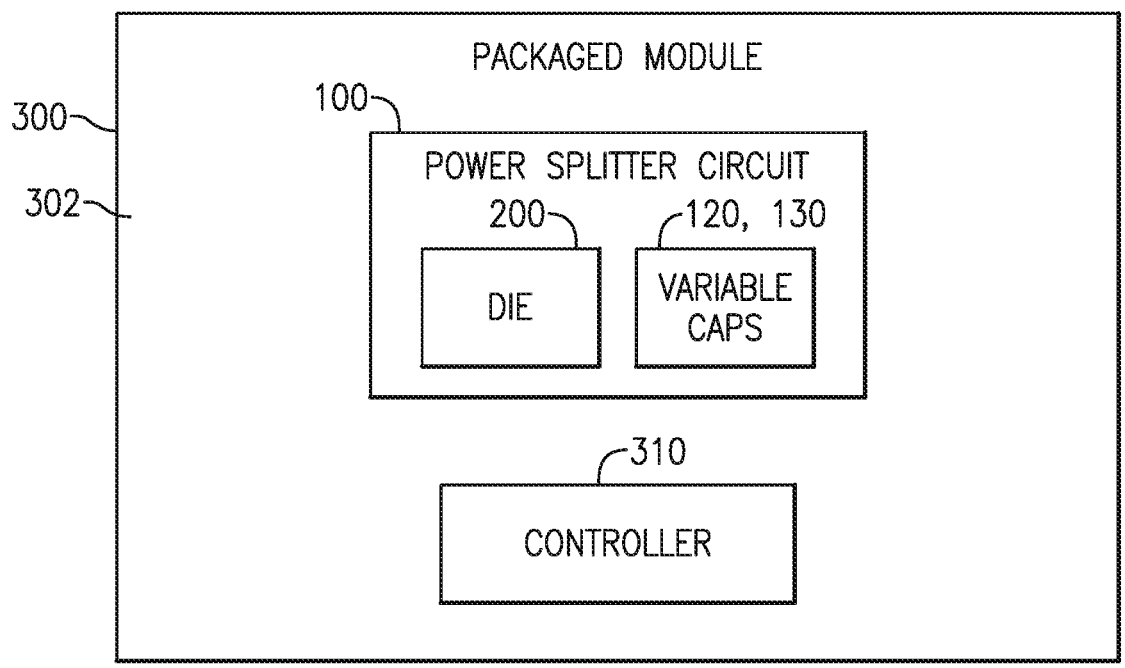
FIG. 13 shows that in some embodiments, some or all of a power splitter circuit having one or more features as described herein can be implemented on a packaged module.

FIG. 13 shows that in some embodiments, some or all of a power splitter circuit 100 having one or more features as described herein can be implemented on a packaged module 300. Such a module can include a packaging substrate 302 configured to receive a plurality of components such as one or more die and one or more passive components.

In the example of FIG. 13, the packaged module 300 can include one or more semiconductor die 200, and some or all of the power splitter circuit 100 can be implemented on such one or more die. In some embodiments, variable capacitors 120, 130 as described herein can be implemented on such one or more die, as discrete elements outside of the one or more die, or any combination thereof. In some embodiments, substantially all of the power splitter circuit 100 can be implemented on a single die. In some embodiments, such a single die can be, for example, a silicon-on-insulator (SOI) die.

In the example of FIG. 13, the packaged module 300 can further include a controller 310. Such a controller can be configured to provide, for example, the logic functionality as described herein to select different values of variable capacitance. In some embodiments, such a controller can be configured to operate with a control standard such as mobile industry processor interface (MIPI) standard.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 14:
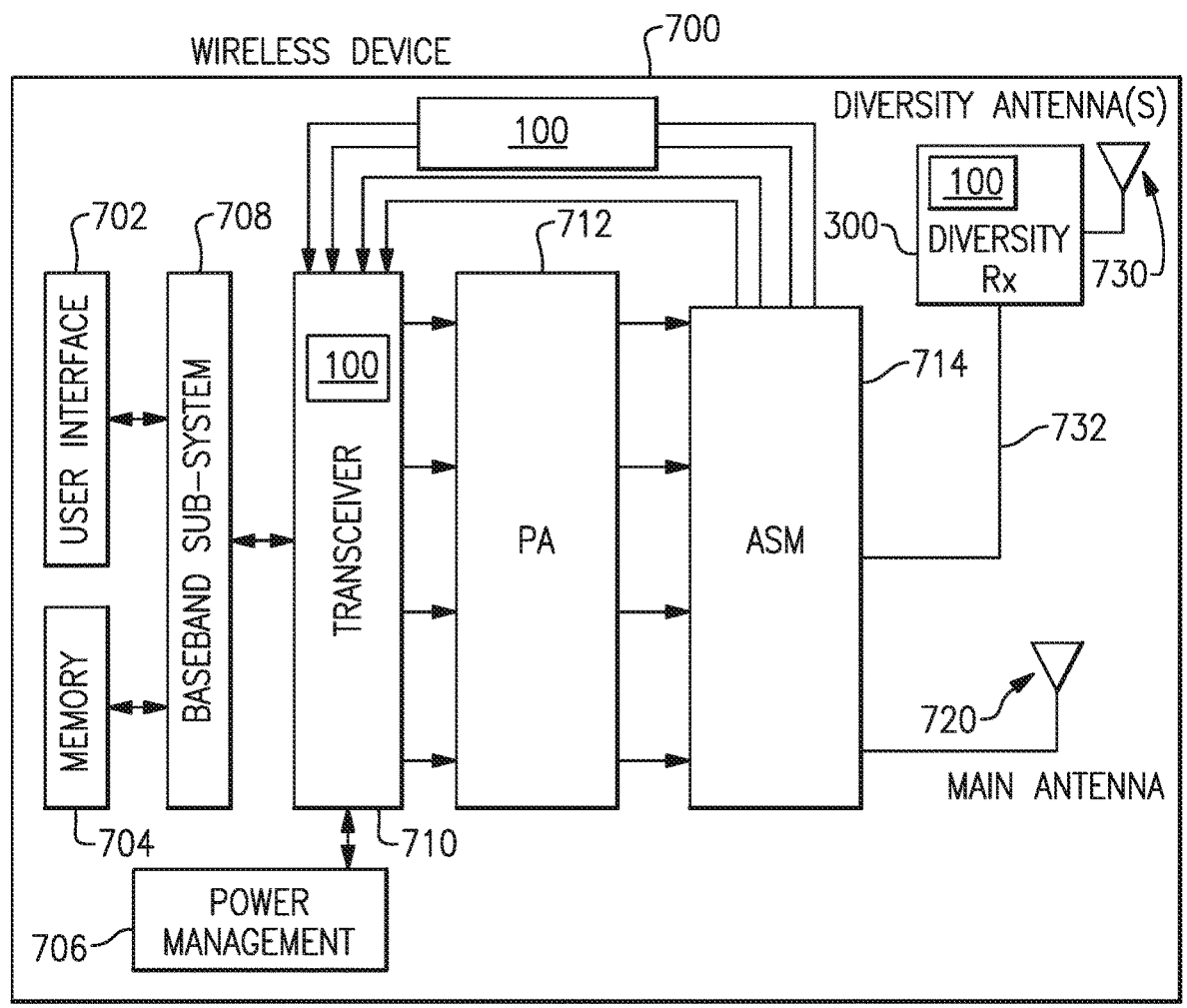
FIG. 14 depicts an example wireless device having one or more advantageous features described herein.

FIG. 14 depicts an example wireless device 700 having one or more advantageous features described herein. As described herein, one or more power splitters having one or more features as described herein can be implemented in a number of places in such a wireless device. For example, in some embodiments, a power splitter 100 having one or more features as described herein can be implemented in a module such as a diversity receive (DRx) module 300 having one or more low-noise amplifiers (LNAs).

In some embodiments, a power splitter 100 having one or more features as described herein can be implemented in a transceiver. Such a power splitter can be implemented as a separate module within the transceiver, or as a part of a transceiver module.

In some embodiments, a power splitter 100 having one or more features as described herein can be implemented between a front-end module (e.g., DRx module) and a transceiver. Such a power splitter can be implemented as a separate module, as an assembly of circuit elements, or any combination thereof.

In the example of FIG. 14, power amplifiers (PAs) in a PA module 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device 700. Such power management can also control operations of the baseband sub-system 708 and other components of the wireless device 700.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example of FIG. 14, the DRx module 300 can be implemented between one or more diversity antennas (e.g., diversity antenna 730) and the ASM 714. Such a configuration can allow an RF signal received through the diversity antenna 730 to be processed (in some embodiments, including amplification by an LNA) with little or no loss of and/or little or no addition of noise to the RF signal from the diversity antenna 730. Such processed signal from the DRx module 300 can then be routed to the ASM through one or more signal paths.

In the example of FIG. 14, a main antenna 720 can be configured to, for example, facilitate transmission of RF signals from the PA module 712. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 4. It will be understood that at least some of the bands can be divided into sub-bands. It will also be understood that one or more features of the present disclosure can be implemented with frequency ranges that do not have designations such as the examples of Table 4.

TABLE 4

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |

TABLE 4-continued

| Band | Mode | Tx Frequency Range (MHz) | Rx Frequency Range (MHz) |
|---|---|---|---|
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power splitter comprising:
    an input port;
    a first output port and a second output port; and
    a first signal path implemented between the input port and the first output port, and a second signal path implemented between the input port and the second output port, each of the first and second signal paths including an input capacitance and an output capacitance arranged in series between the input port and the respective output port, the output capacitance implemented as a variable capacitance configured to provide a plurality of capacitance values that result in different frequency responses of the respective signal path.

2. The power splitter of claim 1 wherein each of the first and second signal paths further includes an inductance that couples a node between the input capacitance and the output capacitance to a ground.

3. The power splitter of claim 2 wherein the inductance is implemented as an inductor.

4. The power splitter of claim 1 wherein the input capacitance of the first signal path is substantially the same as the input capacitance of the second signal path.

5. The power splitter of claim 1 further comprising a control circuit configured to provide control signals to each of the first and second signal paths to thereby select an output capacitance value for the variable capacitance of the respective signal path.

6. The power splitter of claim 5 wherein the control circuit is configured to provide the control signal based on a two-bit input signal.

7. The power splitter of claim 5 wherein the control circuit is configured to operate with mobile industry processor interface (MIPI) standard.

8. The power splitter of claim 1 wherein the variable capacitance includes a plurality of capacitances arranged to be electrically parallel, with each of at least some of the electrically parallel capacitances being coupled to a respective switch, such that different states of the one or more switches allow different electrically parallel capacitances to be connected to provide a respective effective capacitance value for the variable capacitance.

9. The power splitter of claim 8 wherein each of the electrically parallel capacitances is implemented as a capacitor.

10. The power splitter of claim 9 wherein the electrically parallel capacitors includes a first capacitor without a corresponding switch, and one or more capacitors each having a respective switch in series.

11. The power splitter of claim 10 wherein the one or more capacitors electrically parallel with the first capacitor includes a second capacitor and a third capacitor each having a respective switch in series.

12. The power splitter of claim 1 wherein the frequency response includes an isolation characteristic between the first and second output ports.

13. The power splitter of claim 12 wherein the first and second signal paths are configured to route respective signals split from a received signal.

14. A power splitter comprising:
    an input port;
    a first output port and a second output port; and
    a first signal path implemented between the input port and the first output port, and a second signal path implemented between the input port and the second output port, each of the first and second signal paths including a variable capacitance configured to provide a plurality of capacitance values that result in different frequency responses of the respective signal path, such that the power splitter is configured to support carrier aggregation operation involving respective signals in the first and second signal paths.

15. The power splitter of claim 14 wherein the carrier aggregation operation includes a downlink carrier aggregation operation.

16. A radio-frequency module comprising:
    a packaging substrate configured to receive a plurality of components; and
    a power splitter circuit implemented on the packaging substrate and including an input port, a first output port and a second output port, the power splitter circuit further including a first signal path implemented between the input port and the first output port, and a second signal path implemented between the input port and the second output port, each of the first and second signal paths including an input capacitance and an output capacitance arranged in series between the input port and the respective output port, the output capacitance implemented as a variable capacitance configured to provide a plurality of capacitance values that result in different frequency responses of the respective signal path.

17. The radio-frequency module of claim 16 wherein the radio-frequency module is configured to process a received signal.

18. The radio-frequency module of claim 16 further comprising a controller configured to provide control signals to each of the first and second signal paths to thereby select an output capacitance value for each of the variable capacitance of the respective signal path.

19. A wireless device comprising:

an antenna configured to receive a signal; and an input signal path coupled to the antenna and including a power splitter circuit configured to split the received signal from the input signal path into a first signal and a second signal path, the power splitter circuit including an input port, a first output port and a second output port, such that the first signal path is implemented between the input port and the first output port, and the second signal path is implemented between the input port and the second output port, each of the first and second signal paths including an input capacitance and an output capacitance arranged in series between the input port and the respective output port, the output capacitance implemented as a variable capacitance configured to provide a plurality of capacitance values that result in different frequency responses of the respective signal path.

\* \* \* \* \*